(12) United States Patent
Paul (10) Patent No.: US 8,222,922 B2
(45) Date of Patent: Jul. 17, 2012

(54) ROM IMPLEMENTATION FOR ROM BASED LOGIC DESIGN

(75) Inventor: Bipul C. Paul, Santa Clara, CA (US)

(73) Assignee: Toshiba America Research, Inc., San Jose, CA (US)

( * ) Notice: Subject to any disclaimer, the term of this patent is extended or adjusted under 35 U.S.C. 154(b) by 120 days.

(21) Appl. No.: 12/415,856

(22) Filed: Mar. 31, 2009

(65) Prior Publication Data
US 2010/0244892 A1    Sep. 30, 2010

(51) Int. Cl.
*G06F 7/38* (2006.01)

(52) U.S. Cl. .............. 326/40; 326/41; 326/98; 326/113; 365/72; 365/104

(58) Field of Classification Search .............. 326/37–42, 326/43, 47–49, 104–106, 108–110, 119, 326/121, 93, 95, 98, 112–114; 365/72, 94, 365/103–104

See application file for complete search history.

(56) References Cited

U.S. PATENT DOCUMENTS

| 4,773,047 | A  | * | 9/1988  | Uchino et al. ............... 365/181 |
| 5,420,818 | A  | * | 5/1995  | Svejda et al. ............... 365/104 |
| 7,042,779 | B2 | * | 5/2006  | Dudeck et al. ............... 365/203 |
| 2007/0268042 | A1 | * | 11/2007 | Paul ............................... 326/45 |
| 2009/0146689 | A1 | * | 6/2009  | Chandler et al. ............... 326/41 |

OTHER PUBLICATIONS

ROM Based Logic (RBL) Design: High-Performance and Low-Power Adders, B. Paul, et al., I.E.E.E. (2008).*
N. H. E. Weste and K. Eshraghian, "Principles of CMOS VLSI design," Published by Addison Wesley, pp. 532-534 (1999).
See also Applicant's co-pending U.S. Appl. Nos. 11/690,125 and 11/277,299.

* cited by examiner

*Primary Examiner* — Jason M Crawford
(74) *Attorney, Agent, or Firm* — Westman, Hattori, Daniels & Adrian, LLP (57) ABSTRACT

A logic device implementing configurations for ROM based logic uses arrays of memory cells to provide outputs based on inputs received at the logic device. The logic device stores values in the memory cells that are accessed when an input is received. The memory cells are transistors that provide values of '1' or '0.' Various configurations reduce the number of transistors while implementing the memory block by utilizing a single bitline or a dynamic precharge implementation.

16 Claims, 7 Drawing Sheets

ROM IMPLEMENTATION FOR ROM BASED LOGIC DESIGN

FIELD OF THE INVENTION

The present invention relates to implementing read-only memory (ROM) based logic design techniques. More particularly, the present invention relates to a ROM based logic design implementation that reduces identical rows and columns using single transistor cell configurations.

DISCUSSION OF THE RELATED ART

Most current logic computations and logic operations are performed by logic circuits whose fundamental elements are logic gates. In certain applications, read-only memory (ROM) based design has been employed. Memorization of the output of a function for all possible input combinations is an alternative way to implement a logic function. Instead of evaluating a logic function in real-time, the output is read from the ROM, where all possible outputs are pre-stored. The input bits of the function are used as the address to access the ROM. The output is read from the ROM.

For example, ROM based design has been employed in Field Programmable Gate Array (FPGA) architectures, where basic logic gates like NAND, and NOR have been implemented. In addition, a similar approach has also been used to generate series of functions like logarithmic numbers and sinusoidal functions.

These ROM based designs, however, are used for simple logic functions or operations, such as logic functions or operations with a low logic depth (logic depth being related to the maximum number of series-arranged processing elements in a logic circuit). One major reason for slower operation and higher energy consumption in such ROM based design in FPGA architectures, as well as other devices, is the use of this approach for achieving reconfigurability. For this purpose, mainly basic gates are implemented using very small ROM structures (typically, 4 to 16 bit), which requires an increased number of transistors as compared to a conventional CMOS gate.

Moreover, a ROM based design in general results in a larger area than its counterpart with conventional logic gates. Similarly, in the context of implementing series logic functions using ROM based designs, this typically involves the employment of large ROM sizes, which result in large delays (e.g., accessing the memory), increased area usage, and increased power usage as compared to the design with conventional logic gates.

Therefore, existing memory based designs for logic computations and/or logic operations do not relate to high-performance applications. There remains a continued need for improvements in high performance logic computations and logic operations. Further, a need exists for proper implementation of the logic circuits including solutions for the problems noted above.

SUMMARY OF THE INVENTION

A ROM based design technique implementation and configuration is disclosed that reduces power consumption, increases performance, reduces area and is robust. The disclosed embodiments achieve these improvements by reducing memory size by eliminating identical rows and columns. The disclosed embodiments also reduce the critical path length and improve the performance yet achieve low-power dissipation due to reduced number of switching.

Thus, the disclosed embodiments recite a logic device. The logic device includes an array of read-only memory (ROM) cells comprising transistors. Each single transistor ROM cell stores a value that is read from the cell to provide an output in response to an input pertaining to a logic design. The logic device also includes a plurality of wordlines coupled to a plurality of bitlines through the single transistor ROM cells. The logic device also includes a transmission gate or pass transistor coupled to the bitline to select the value of the single transistor ROM cell read due to the input and provided to the output.

According to the disclosed embodiments, another logic device is disclosed. The logic device includes an array of read-only memory (ROM) cells comprising transistors. Each cell stores a value that is read from the cell to provide an output in response to an input pertaining to a logic design. The logic device also includes a plurality of wordlines coupled to the array of ROM cells. The cells storing a value of '1' are configured in parallel and coupled to a first column select transistor. The cells storing a value of '0' are configured in parallel and coupled to a second column select transistor. The output is the value of '1' or '0' based on a cell when a bitline is selected at the first column select transistor or the second column select transistor.

Further according to the disclosed embodiments, another logic device is disclosed. The logic device includes a plurality of read-only memory (ROM) cells comprising transistors. Each cell stores a value that is read from the cell to provide an output in response to an input pertaining to a logic design, and the plurality of cells are accessible by at least one wordline and at least one bitline. The logic device also includes the output being precharged to a first value. The logic device also includes the plurality of cells store a second value. The logic device also includes a clock signal used to precharge the output and evaluate the plurality of cells.

BRIEF DESCRIPTION OF THE DRAWINGS

The accompanying drawings are included to provide further understanding of the invention and constitute a part of the specification. The drawings listed below illustrate embodiments of the invention and, together with the description, serve to explain the principles of the invention, as disclosed in the claims.

DETAILED DESCRIPTION OF THE PREFERRED EMBODIMENTS

Reference will now be made in detail to the preferred embodiments of the present invention. Examples of the preferred embodiments are illustrated in the accompanying drawings.

Figure 1:
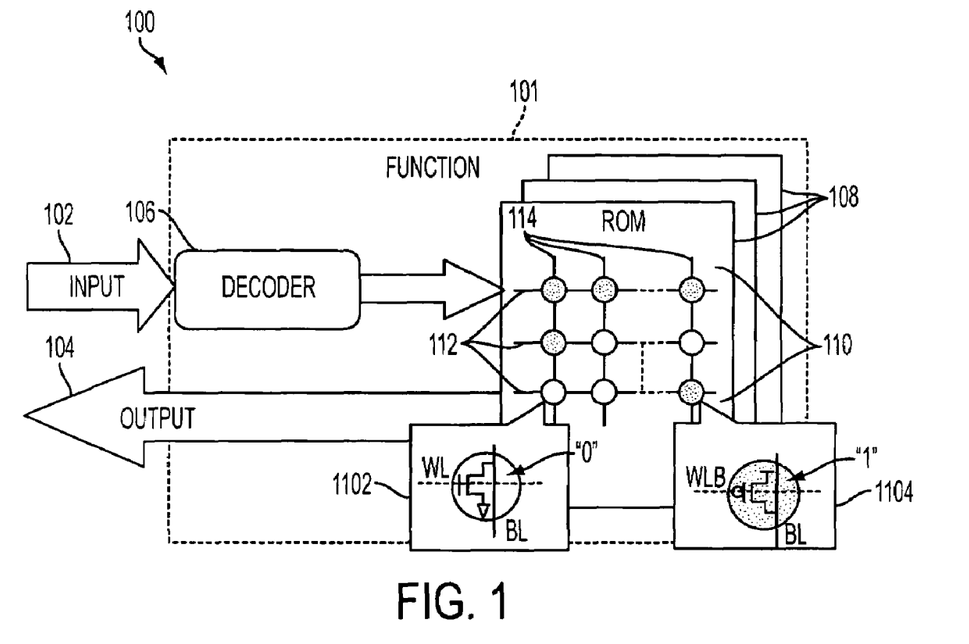
FIG. 1 illustrates a schematic of ROM based logic device with fast single transistor cells according to the disclosed embodiments.

FIG. 1 depicts a schematic of ROM based logic device 100 with fast single transistor cells 110 according to the disclosed embodiments. Device 100 includes a function 101 implementing a decoder 106 that receives input 102. Function 101 also may be known as a logic circuit design. Device 100 then accesses the array of memory cells 110 to produce output 104. Memory cells 110 may be configured into arrays 108. Output 104 is a function of input 102.

Memory cells 110 can be a wide range of memory cells, including but not limited to, read-only-memory cells (hereafter ROM) and non-ROMs, such as programmable memory devices, as long as the memory devices are capable of storing digital information (e.g. "0" and "1"). It is noted that, in the following discussions, a ROM is referred to as a memory device that can only be read; and content stored in the ROM cannot be changed or rewritten after the ROM is fabricated.

In some examples of this disclosure, memory cells 110 of the memory cell arrays 108 in device 100 are NMOS, PMOS or combinations thereof for storing logic bits "0" and "1."

Some examples of this disclosure can be employed within high performance logic circuits. In some examples, preferred embodiments can be employed within Adders, Multipliers, Fast Fourier Transform (FFT) Compilers, Finite Impulse Response (FIR filters), etc. In this disclosure, high performance logic circuits can include, in some embodiments, circuits that perform two or more logical operations, and, in some other embodiments, circuits that perform three or more logical operations, and, in some preferred embodiments, circuits that perform five or more logical operations, and, in some preferred embodiments, circuits that perform ten or more logical operations.

Moreover, in this disclosure, high performance logic circuits can include, in some embodiments, circuits that have a logic depth of two or more, and, in some other embodiments, circuits that have a logic depth of three or more, and, in some preferred embodiments, circuits that have a logic depth of five or more, and, in some preferred embodiments, circuits that have a logic depth of ten or more.

To achieve high performance, logic circuit can be divided into smaller blocks; each of the smaller blocks being implemented with Read Only Memory arrays 108 in which outputs corresponding to input combinations are pre-stored; and inputs to each of the respective smaller blocks being used as a respective address to access a respective Read Only Memory. The blocks are optimally sized large enough to inhibit slower performance and small enough to inhibit larger delay and power requirements.

The size of a memory cell array 108 for a specific logic computation can be reduced, even though not required, by removing duplicate memory cell rows and/or columns in the array. Elimination of memory cells in rows, columns, and sub-blocks can be applied individually or in any combinations thereof. As such, accessing speed to the memory cells in the array can be improved; and the area of the memory cell array of the computation system can be reduced, which in turn, reduces power consumption.

Examples of this disclosure can be employed within a wide range of logic circuits, such as Adders, Multipliers, Fast Fourier Transform (FFT) Compilers, and Finite Impulse Response (FIR filters).

In the following, selected examples will be discussed with particular examples wherein the memory cells are ROMs, it will be appreciated by those skilled in the art that the following discussion is for demonstration purpose, and should not be interpreted as a limitation. Instead, other variations within the scope of this disclosure are also applicable.

For accomplishing a specific logic function, such as adder, FIR, ALU, and other logic functions, such that output 104 is the specific function of input 102, memory cells 110 each store a result for a specific combination input signals 102 based on a specific logic function.

In operation, input 102 is an input signal operated as an addressing signal for memory cells; and a specific combination of the input signal causes a specific memory cell 110 in an array 108 to be addressed such that the information (bit) stored in this addressed memory cell is output from function 101. Such output 104 corresponds to the result of the specific combination of input 102 based on the logic function.

As shown in FIG. 1, memory cell array 108 comprises memory cells, such as memory cells 110, which can be any types of memory cells, such as ROM. Memory cells 110 are arranged into rows and columns in the array such that the memory cells in each row are connected to a wordline 112 for addressing memory cells 110. Further, memory cells 110 in each column are connected to a bitline 114 for reading (outputting) the contents in memory cells 110.

An array 108 may include a plurality of wordlines 112 and bitlines 114. In general, wordlines 112 of array 108 are connected to decoder 106 that is capable of generating proper addressing signals; and bitlines 114 are connected to decoder 106 for generating proper outputs from read-outs from memory cells 110.

As discussed above, the memories in memory cell array 108 can be any types of memory devices, examples of which can be NMOS and PMOS transistors, as schematically illustrated in FIG. 1. In this example, a wordline having a wordline signal WL is connected to the gate of NMOS transistor 1102 and a bitline BL is connected to the source of NMOS transistor 1102.

A wordline 112 with a wordline signal WLB that is complementary to the wordline signal WL is connected to the gate of PMOS transistor 1104; and a bitline BL is connected to the source of PMOS transistor 1102. With this configuration, PMOS transistor 1104 can be designated to store logic bit "1" while NMOS transistor 1102 can be designated to store logic bit "0."

PMOS transistor 1104 is addressed when the addressing wordline WLB connected thereto has a low voltage. The addressed PMOS outputs a high voltage, representing logic "1," to the bitline BL connected thereto such that the bitline BL outputs a high voltage, representing logic "1."

NMOS transistor 1102 is addressed when the addressing wordline WL connected thereto has a high voltage. The addressed NMOS outputs a low voltage, representing logic "0," to the bitline BL connected thereto such that the bitline BL outputs a low voltage, representing logic "0." It is noted that WL and WLB do not necessarily have separate addresses. When a ROW (e.g., WL) is enabled, it also enables WLB. Hence, bitlines connected to NMOS transistors in that ROW are discharged to '0' and bitlines connected to PMOS transistors are charged to '1.'

Each memory cell of the memory cell array in the memory based computation system comprises one transistor that is either PMOS transistor 1104 or NMOS transistor 1102. Memory cell array 108 comprises both NMOS and PMOS transistors for storing logic "0" and logic "1" respectively.

In another example, memory cells 110 of memory cell array 108 are either the NMOS or the PMOS transistors. Memory cell array 108 is composed of only one of the NMOS and PMOS transistors, which is not illustrated in the figure. In other examples, non-silicon and/or other emerging non-volatile memory cells can be further employed as memory so as to further provide compact design while enabling faster and low power design.

In this context, device 100 can efficiently utilize these advancements in memory technology, resulting in very high performance designs. By way of example, some illustrative emerging memories include non-silicon materials, inorganic materials, organic materials, single molecule materials, carbon nanotube memories, copper sulphide, phase change devices, cadmium sulphide and/or other emerging memories.

Logic device 100 disclosed above can be implemented for accomplishing many types of logic operations, computations, and/or logic functions. Moreover, in this disclosure, high performance logic computations can include, in some examples, computations that have a logic depth of two or more, and, in some other examples, computations that have a logic depth of three or more, and, in some preferred examples, computations that have a logic depth of five or more, and, in some preferred examples, computations that have a logic depth of ten or more. Examples logic computations, operations, and logic algorithms in which examples of this disclosure can be implemented include, but not limited to, Adders, Multipliers, Fast Fourier Transform (FFT) Compilers, and Finite Impulse Response (FIR filters).

Figure 2A:
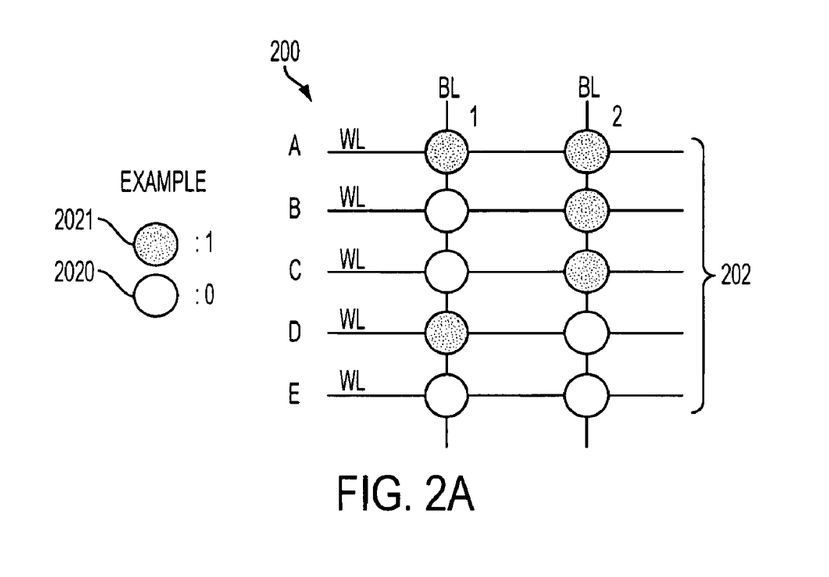
FIGS. 2a and 2b depict a configuration of a ROM block using single transistor cells according to the disclosed embodiments.
Figure 2B:
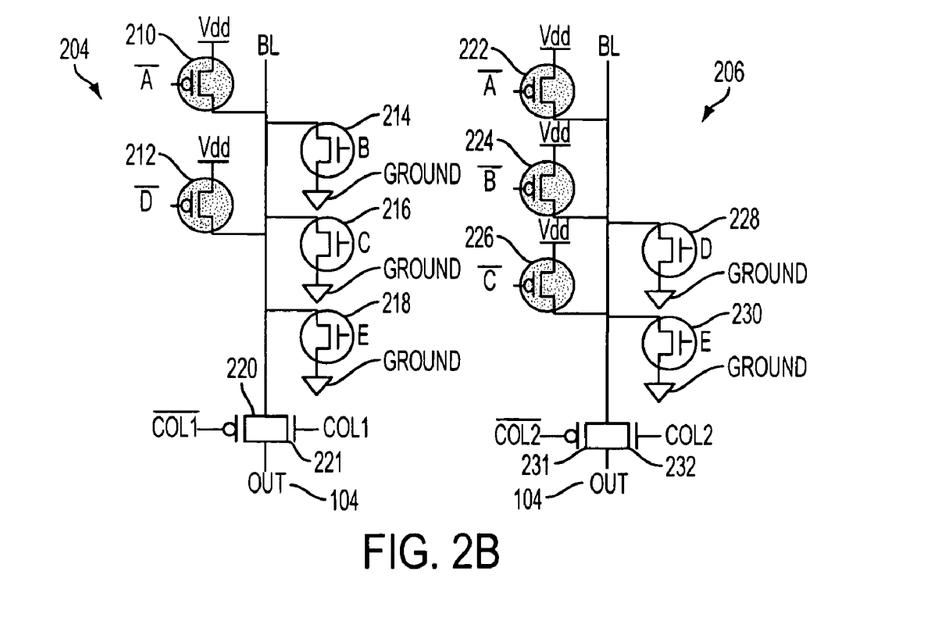

Innovative implementation of ROM cells in an array can improve the power and performance of ROM based logic design. FIGS. 2a and 2b depict a configuration of a ROM block 200 using single transistor cells 202 according to the disclosed embodiments. ROM block 200 includes five rows A, B, C, D and E and two columns 1 and 2 with circles 2021 representing a value of '1' and circles 2020 representing a value of '0.' Thus, referring to FIG. 2a, row A includes a value of '1' in column 1 and a value of '1' in column 2. Row B includes a value of '0' in column 1 and a value of '1' in column 2.

FIG. 2b shows a configuration 204 of ROM block 200 with NMOS transistors storing a '0' and PMOS transistors storing a '1.' Configuration 204 includes five transistors for the values shown in FIG. 2a. Transistors 210 and 212 store a value of '1' as shown in ROM block 200 and are each coupled separately to voltage $V_{dd}$. When a signal is received on the wordlines coming into transistors 210 and 212, then the output goes to '1, which becomes output 104 when the transmission gate is enabled. The transmission gate includes column select PMOS transistor 220 and column select NMOS transistor 221. PMOS transistor 220 passes a value of '1' and NMOS transistor 221 passes a value of '0.' When column 1 is selected, both transistors 220 and 221 are enabled. Transistor 210 is coupled to the wordline for row A while transistor 212 is coupled to the wordline for row D.

Transistors 214, 216 and 218 store a value of '0' and are also connected to the bitline for column 1. Transistors 214, 216 and 218 also are coupled separately to ground. Transistor 214 is coupled to the wordline for row B, transistor 216 is coupled to the wordline for row C and transistor 218 is coupled to the wordline for row E. When these transistors receive a signal from their respective wordline, then they pull their signal to ground and output a '0.' Output 104 becomes '0' when the transmission gate of transistors 220 and 221 is enabled.

Configuration 206 operates in the same manner as configuration 204. Transistor 222 is coupled to the wordline for row A and so on. One difference in configuration 206 is that transistors 222, 224 and 226, which are coupled to the wordlines for rows A, B and C, respectively, are coupled separately to $V_{dd}$ and store a value of '1.' Transistors 228 and 230 coupled to the wordlines for rows D and E, are coupled separately to ground, and store a value of '0.' The transmission gate of column select PMOS transistor 231 and column select NMOS transistor 232 pass the appropriate value to output 104 when column 2 is selected.

Thus, by implementing configurations 204 and 206, the disclosed embodiments have one transistor connected between a wordline and a bitline based on the data shown in memory block 200. A bitline is selected through a transmission gate, or a pass transistor. Configurations 204 and 206 thus provide a reduced area and power consumption while also providing ease of layout.

Figure 3A:
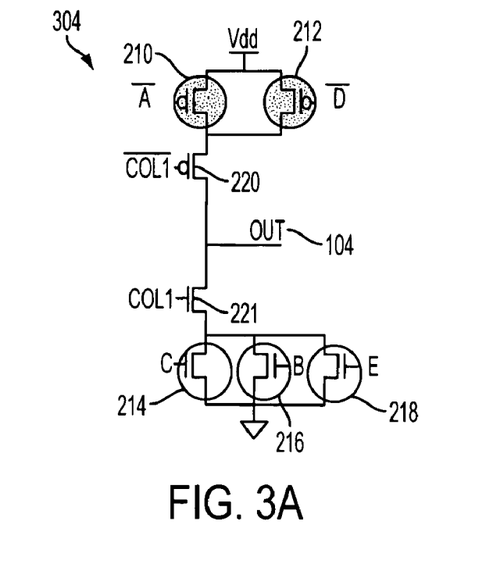
FIG. 3 depicts the ROM block according to a different configuration according to the disclosed embodiments.
Figure 3B:
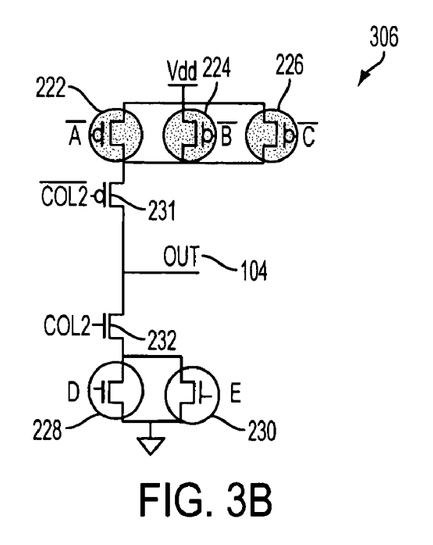

FIG. 3 depicts ROM block 200 according to a different configuration according to the disclosed embodiments. ROM block 200 is shown in FIG. 2a above. Using the same values for the transistors in ROM block 200, configurations 304 and 306 implement the transistors of ROM block 200 in a different way. Parallel transistors storing '1's are separated from those storing '0's by bitline select transistor.

The configurations shown in FIG. 3 may be known as implementing a static complex gate design. This static complex gate design is used to provide the appropriate values to output 104 in response to input 102.

Thus, transistors 210 and 212 of configuration 304 store a value of '1' and are coupled between $V_{dd}$ and column select PMOS transistor 220. Transistors 214, 216 and 218 store a value of '0' and are coupled between ground and column select NMOS transistor 221. With regard to configuration 306, transistors 222, 224 and 226 store a value of '1' and are coupled between $V_{dd}$ and column select PMOS transistor 231. Transistors 228 and 230 store a value of '0' and are coupled between ground and column select NMOS transistor 232. Depending on which column is selected, output 104 is read from memory block 200.

Within configuration 304, if column 1 is selected, then output 104 is determined by which row is selected. As the signal on the appropriate wordline selects the transistor, the value is read or pulled depending on whether the transistor is coupled to $V_{dd}$ or ground. Thus, the signal comes into transistors 220 and 221 and pulls the desired value.

As can be seen in FIG. 3, only one leakage path per column is provided between $V_{dd}$ and ground. By using the column select transistors in this configuration, the number of leakage paths is reduced. These configurations shown in FIG. 3 reduce leakage power and improve noise immunity.

Figure 4A:
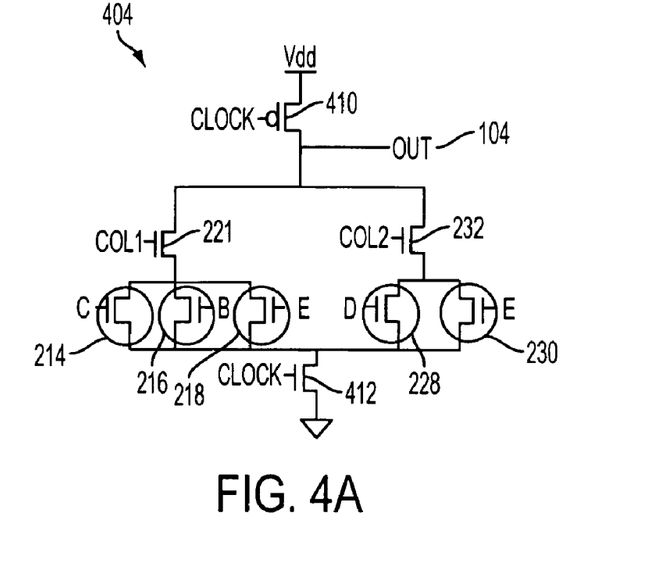
FIGS. 4a and 4b illustrate the ROM block according to another configuration according to the disclosed embodiments.
Figure 4B:
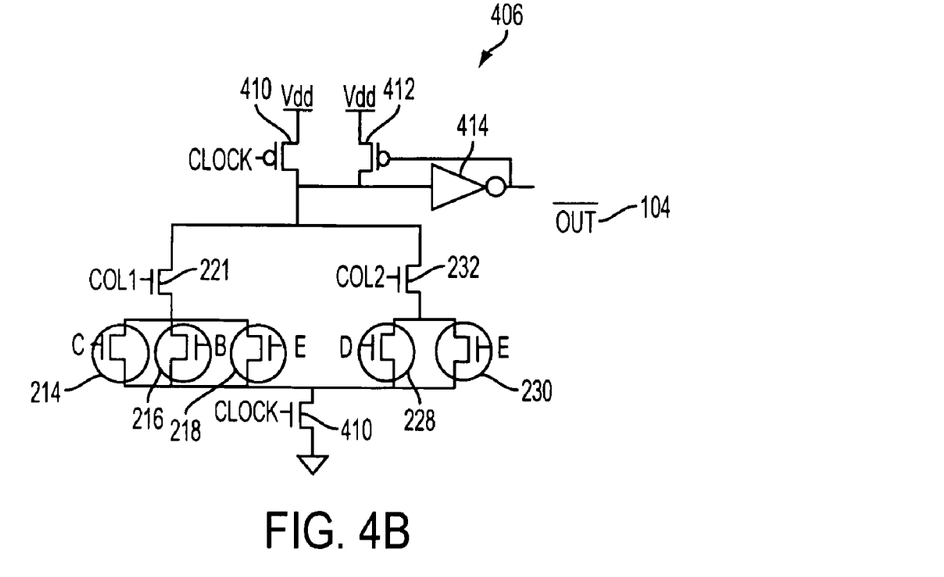

FIGS. 4a and 4b depict ROM block 200 according to another configuration according to the disclosed embodiments. Configurations 404 and 406 implement ROM block 200 using precharge evaluate logic to provide output 104. Configuration 404 includes memory cells from columns 1 and 2, while configuration 406 also includes memory cells from both columns of ROM block 200. Configurations 404 and 406 use clock signals to precharge the logic design to provide one value. The clock signals are received at transistors 410 and 412.

Only one type of data is stored within the cells. Referring to configuration 404, the number of cells is reduced because only those storing values of '0' are implemented. Cells from ROM block 200 having a value of '1' are not implemented in configuration 404.

Instead, output 104 is precharged to high, or '1,' when clock signal is low. PMOS transistor 410 receives the low clock signal and pulls output 104 to $V_{dd}$. During evaluation, when clock signal is high and if the target data is '0,' then output 104 is pulled to ground. In this instance, transistor 214, 216 or 218 of column 1 is selected or transistor 228 or 230 of column 2 is selected. Transistors 221 or 232 pass the value through when the appropriate bitline is selected.

This configuration uses a dynamic precharge high design, and improves performance by reducing the load capacitance. The number of transistors may be reduced. The noise issue of this configuration may be handled using a keeper transistor 412 and inverter 414 as shown in FIG. 4b. The keeper circuit reduces noise associated with dynamic logic.

Figure 5A:
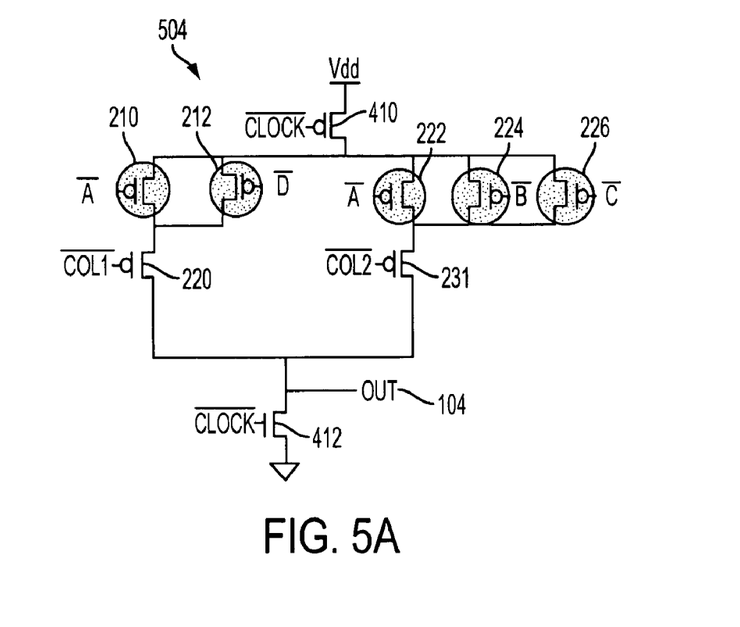
FIGS. 5a and 5b illustrate the ROM block according to another configuration according to the disclosed embodiments.
Figure 5B:
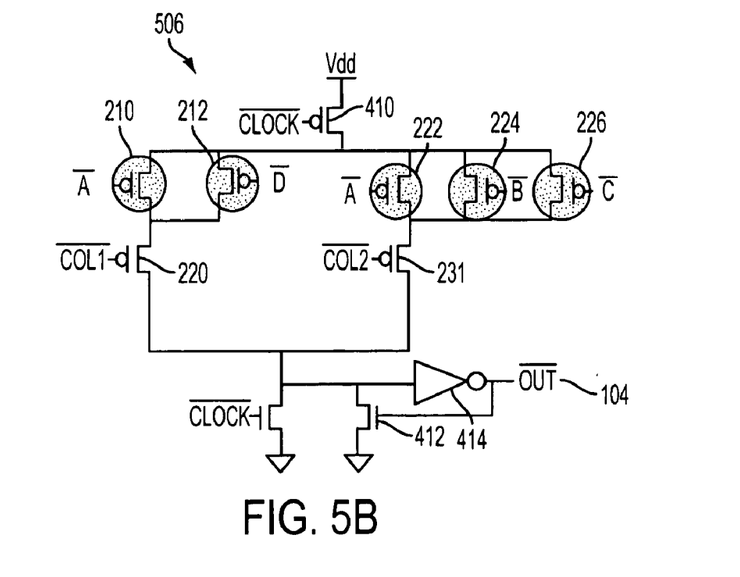

FIGS. 5a and 5b depict the same implementation of FIGS. 4a and 4b, except using a dynamic precharge low design. The cells of ROM block 200 storing a value of '1' are implemented in configurations 504 and 506. The output is predischarged to ground, or '0,' when the clock signal is low, and evaluates a '1' when the clock signal is high. Transistors 210 and 212 of column 1 and transistors 222, 224 and 226 of column 2 are coupled to PMOS transistor 410, which in turn is coupled to $V_{dd}$. These transistors store a value of 1 within ROM block 200. Configuration 504 will output a '0' unless one of the transistors is selected by the appropriate row address. Transistor 410 pulls $V_{dd}$ when clock signal is high and the appropriate bitline corresponding to column select transistors 220 or 231 is selected.

Referring to FIG. 5b, configuration 506, like configuration 406, implements a keeper 412 and an inverter 414 to reduce noise caused by using a dynamic logic circuit.

Figure 6:
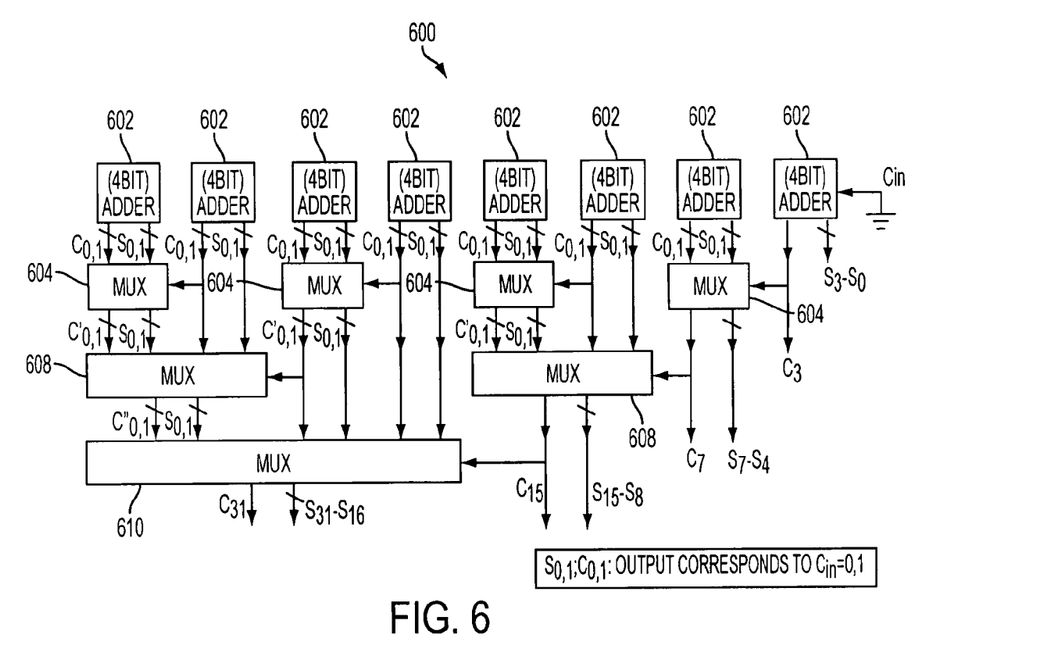
FIG. 6 illustrates a conditional sum adder according to the disclosed embodiments.

FIG. 6 depicts a conditional sum adder 600 according to the disclosed embodiments. Adder 600 preferably is a low power 32 bit adder. Adder 600 includes eight (8) 4-bit ROM based adder blocks 602. Each block provides two sets of 4 bit sum and a carry outputs. One set for carry-in equals to 'low' (Cin='0') and one for 'high' (Cin='1'). Appropriate outputs are selected based on the carry input from the previous blocks.

Multiplexers 604 are coupled directly to adder blocks 602 and help in carrying the results of the outputs to the appropriate downstream multiplexer 608. As shown in FIG. 6, each multiplexer 604 receives inputs two adder blocks 602. Two multiplexers 604, in turn, output their results to multiplexers 608. The two multiplexers 608 output their results to multiplexer 610. Multiplexer 610 provides the result for adder 600.

Figure 7:
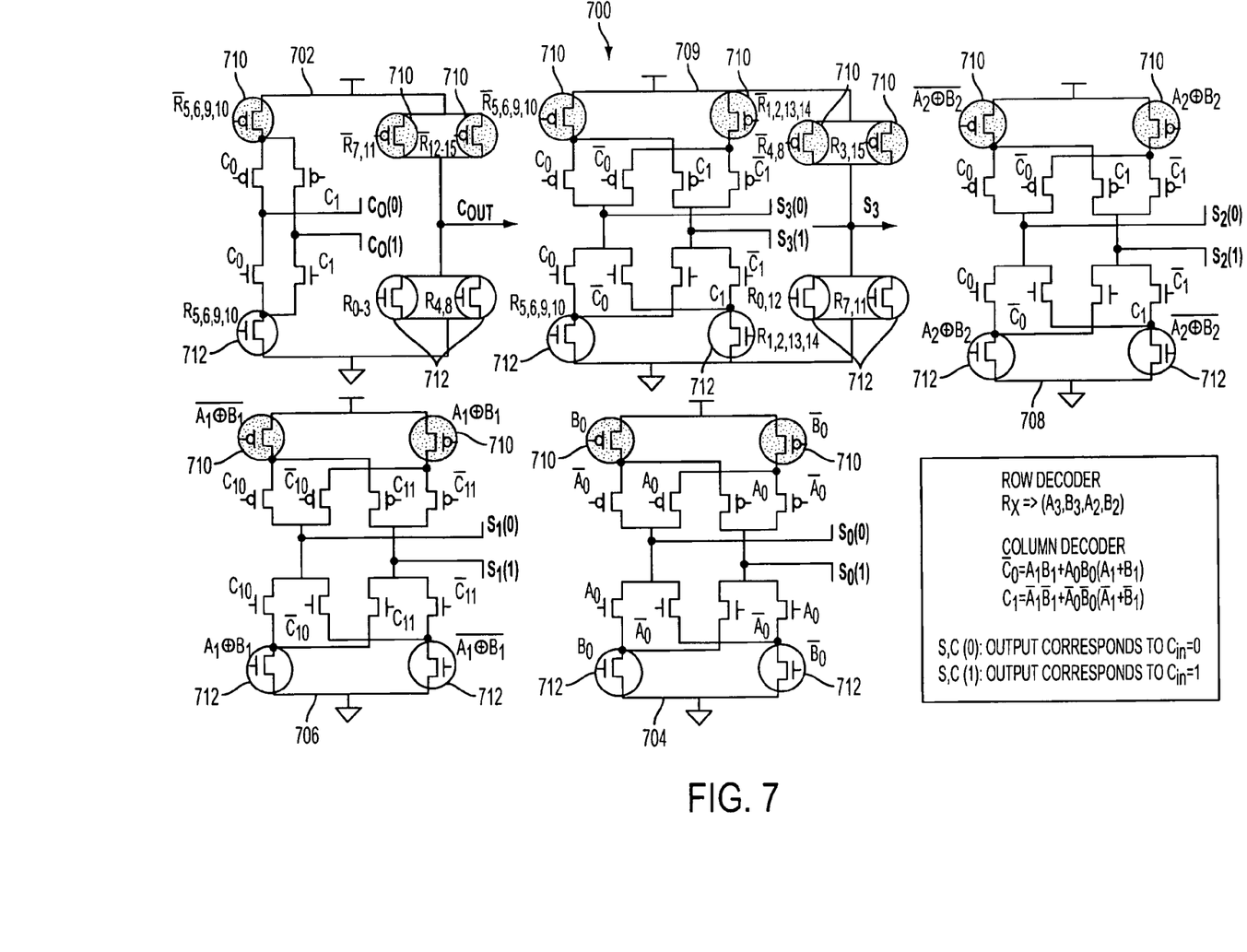
FIG. 7 illustrates a detailed ROM implementation of a conditional sum adder block of the adder according to the disclosed embodiments.

FIG. 7 depicts a detailed ROM implementation of a conditional sum adder block 602 of adder 600 according to the disclosed embodiments. Adder block 602 includes 4 sums ($S_3$–$S_0$) and a carry output ($C_{out}$). All memory blocks are configured based on the embodiments disclosed above, especially those associated with FIGS. 3a and 3b. Cells 710 store values of '1' while cells 712 store values of '0.' Configuration 702 pertains to the carry out memory block that provides a value of '1' or '0' for $C_{out}$. Configuration 704 pertains to the sum memory block that provides a value of '1' or '0' for $S_0$. Configuration 706 pertains to the sum memory block that provides a value of '1' or '0' for $S_1$. Configuration 708 pertains to the sum memory block that provides a value of '1' or '0' for $S_2$. Configuration 709 pertains to the sum memory block that provides a value of '1' or '0' for $S_3$.

The appropriate transistors are accessed to read their values based on the input signal received at adder block 602. Only 26 transistors for the memory cells are needed to implement adder block 602. This smaller number contrasts with the over 1200 transistors needed for the conventional ROM based design.

Thus, the disclosed embodiments provide ROM based logic design implementations and configurations that significantly improve the performance of large digital functions by reducing the critical path length, while also reducing the area from conventional ROM design. The impact of power consumption, however, depends on the specific design and configuration applied to the ROM block.

The disclosed embodiments may be used to achieve high performance and low power operations. Further, all state-of-the-art low-power and high-performance design techniques such as body biasing, clock gating, and the like also can be employed.

It will be apparent to those skilled in the art that various modifications and variations can be made in the disclosed embodiments of the present invention without departing from the spirit or scope of the invention. Thus, it is intended that the present invention covers the modifications and variations of the embodiments disclosed above provided that they come within the scope of any claims and their equivalents.

What is claimed is:

1. A logic device comprising:
   an array of read-only memory (ROM) cells comprising transistors, wherein each cell stores a value that is read from the cell to provide an output in response to an input pertaining to a logic design;
   a plurality of wordlines coupled to the array of ROM cells;
   the cells storing a value of '1' are configured in parallel and coupled to a first column select transistor;
   the cells storing a value of '0' are configured in parallel and coupled to a second column select transistor,
   wherein the output is the value of '1' or '0' based on a cell when a bitline is selected by the first column select transistor and the second column select transistor,
   wherein said first and second column transistors are pass transistors or transmission gates, and wherein said first column select transistor only passes through a value of '1' and said second column select transistor only passes through a value of '0'.

2. The logic device of claim 1, wherein the ROM cells are configured as a static complex gate.

3. The logic device of claim 1, wherein the cells storing a value of '1' also are coupled to a voltage.

4. The logic device of claim 1, wherein the cells storing a value of '0' also are coupled to ground.

5. The logic device of claim 1, wherein the logic device comprises a conditional sum adder.

6. A logic device comprising:
   a plurality of read-only memory (ROM) cells comprising transistors,
   wherein each cell stores a value that is read from the cell to provide an output in response to an input pertaining to a logic design, and the plurality of cells are accessible by at least one wordline and at least one bitline;
   wherein the output is precharged to a first value;
   the plurality of cells store a second value;
   a clock signal is used to precharge the output and evaluate the plurality of cells, and
   the clock signal controls a first gate and a second gate, and said first gate connects a power voltage to said ROM cells, and said second gate connects a ground voltage to said ROM cells.

7. The logic device of claim 6, wherein the at least one wordline accesses the subset of the plurality of cells.

8. The logic device of claim 6, wherein the at least one wordline is coupled with the at least one bitline through a memory cell.

9. The logic device of claim 6, wherein the first value is a '1.'

10. The logic device of claim 6, wherein the first value is a '0.'

11. The logic device of claim 6, wherein the second value is opposite the first value.

12. The logic device of claim 6, further comprising a keeper coupled to the output.

13. The logic device of claim 6, wherein the logic device comprises a conditional sum adder.

14. The logic device of claim 6, wherein a low clock signal precharges the output and a high clock signal evaluates the plurality of cells.

15. The logic device of claim 6, wherein said first gate directly connects a power voltage to said ROM cells.

16. The logic device of claim 6, wherein said second gate directly connects a ground voltage to said ROM cells.

* * * * *